(12) United States Patent
Ebner

(10) Patent No.: US 9,562,665 B2
(45) Date of Patent: Feb. 7, 2017

(54) LIGHT MODIFIER HAVING COMPLEX LENSES FOR LED LUMINAIRES

(75) Inventor: Stephan Ebner, Dornbirn (AT)

(73) Assignee: ZUMTOBEL LIGHTING GMBH, Dornbirn (AT)

(*) Notice: Subject to any disclaimer, the term of this patent is extended or adjusted under 35 U.S.C. 154(b) by 426 days.

(21) Appl. No.: 14/131,630

(22) PCT Filed: Jul. 5, 2012

(86) PCT No.: PCT/EP2012/063135
§ 371 (c)(1),
(2), (4) Date: Feb. 10, 2014

(87) PCT Pub. No.: WO2013/007595
PCT Pub. Date: Jan. 17, 2013

(65) Prior Publication Data
US 2014/0313742 A1    Oct. 23, 2014

(30) Foreign Application Priority Data

Jul. 8, 2011 (DE) .................. 10 2011 078 865
Oct. 27, 2011 (DE) .................. 10 2011 085 289

(51) Int. Cl.
*F21V 5/08* (2006.01)
*F21V 5/04* (2006.01)
(Continued)

(52) U.S. Cl.
CPC ........... *F21V 5/048* (2013.01); *B29C 45/0003* (2013.01); *B29C 45/16* (2013.01); *B29D 11/0048* (2013.01); *F21K 9/60* (2016.08); *F21V 5/007* (2013.01); *F21V 5/04* (2013.01); *F21V 7/0066* (2013.01); *G02B 19/0066* (2013.01); *G02B 27/0955* (2013.01); *H01L 33/58* (2013.01); *B29C 2045/1601* (2013.01); *F21Y 2101/00* (2013.01);
(Continued)

(58) Field of Classification Search
CPC ......... F21V 5/048; G02B 3/0056; G02B 3/04; G02B 3/08; G02B 13/002; G02B 13/08; G02B 13/10
See application file for complete search history.

(56) References Cited

U.S. PATENT DOCUMENTS 2,215,900 A * 9/1940 Bitner .................. F21V 5/04
                                                 359/718
2,254,962 A    9/1941 Harris et al.
(Continued)

FOREIGN PATENT DOCUMENTS

CN    101324317    12/2008
DE    29915907     12/1999
(Continued)

OTHER PUBLICATIONS

Machine Translation of JP 2008221530 A to Oshima Denki Co Sep. 25, 2008, 19 Pages.
(Continued)

*Primary Examiner* — Ismael Negron
(74) *Attorney, Agent, or Firm* — Brooks Kushman P.C.

(57) ABSTRACT

Lens having a cavity defining a light entrance section of the lens, and a light exit surface opposite the light entrance section, and a beam splitting element formed on the light entrance section of the lens.

11 Claims, 4 Drawing Sheets

(51) Int. Cl.
| | |
|---|---|
| *F21V 5/00* | (2015.01) |
| *F21V 7/00* | (2006.01) |
| *G02B 19/00* | (2006.01) |
| *G02B 27/09* | (2006.01) |
| *H01L 33/58* | (2010.01) |
| *B29D 11/00* | (2006.01) |
| *B29C 45/00* | (2006.01) |
| *B29C 45/16* | (2006.01) |
| *F21Y 101/00* | (2016.01) |

(52) U.S. Cl.
CPC ......... *F21Y 2103/10* (2016.08); *F21Y 2115/10* (2016.08)

(56) References Cited

U.S. PATENT DOCUMENTS

| | | | |
|---|---|---|---|
| 5,485,317 A | 1/1996 | Perissinotto et al. | |
| 6,170,971 B1 | 1/2001 | Godbillon | |
| 6,536,923 B1* | 3/2003 | Merz | F21S 48/215 362/245 |
| 6,554,451 B1* | 4/2003 | Keuper | F21V 5/02 362/237 |
| 6,724,543 B1* | 4/2004 | Chinniah | F21S 48/2212 359/718 |
| 6,945,674 B2 | 9/2005 | Yoneda et al. | |
| 7,349,163 B2* | 3/2008 | Angelini | F21K 9/00 257/99 |
| 7,438,444 B2* | 10/2008 | Pao | G02B 19/0071 362/327 |
| 7,674,018 B2* | 3/2010 | Holder | F21K 9/00 362/311.02 |
| 7,766,509 B1* | 8/2010 | Laporte | F21V 5/04 362/249.02 |
| 7,837,349 B2 | 11/2010 | Chinniah et al. | |
| 7,918,583 B2* | 4/2011 | Chakmakjian | F21V 5/007 362/237 |
| 8,007,140 B2* | 8/2011 | Zhang | F21V 5/04 362/296.05 |
| 8,025,429 B2 | 9/2011 | Ho et al. | |
| 8,235,547 B2 | 8/2012 | Hofmann | |
| 8,251,550 B2 | 8/2012 | Lai | |
| 8,348,475 B2* | 1/2013 | Wilcox | F21V 5/008 362/311.02 |
| 2005/0094393 A1 | 5/2005 | Czajkowski | |
| 2005/0135106 A1 | 6/2005 | Kittelmann et al. | |
| 2006/0050528 A1 | 3/2006 | Lyons et al. | |
| 2006/0083016 A1 | 4/2006 | Okamura et al. | |
| 2006/0083023 A1 | 4/2006 | Ayabe et al. | |
| 2006/0091414 A1 | 5/2006 | Ouderkirk et al. | |
| 2006/0146531 A1 | 7/2006 | Reo et al. | |
| 2006/0268556 A1 | 11/2006 | Hsieh | |
| 2007/0195534 A1 | 8/2007 | Ha et al. | |
| 2007/0201225 A1 | 8/2007 | Holder et al. | |
| 2009/0046468 A1 | 2/2009 | Wang et al. | |
| 2009/0225543 A1 | 9/2009 | Jacobson et al. | |
| 2009/0323330 A1* | 12/2009 | Gordin | F21V 5/04 362/235 |
| 2010/0038657 A1 | 2/2010 | Higuchi et al. | |
| 2010/0073938 A1 | 3/2010 | Ho | |
| 2010/0195330 A1 | 8/2010 | Schaefer et al. | |
| 2010/0284194 A1 | 11/2010 | Miyashita et al. | |
| 2010/0295071 A1 | 11/2010 | Tsai et al. | |
| 2011/0063857 A1 | 3/2011 | Li et al. | |
| 2011/0096533 A1 | 4/2011 | Sekela et al. | |
| 2011/0103051 A1 | 5/2011 | Wilcox et al. | |
| 2011/0103070 A1 | 5/2011 | Zhang et al. | |
| 2011/0156584 A1 | 6/2011 | Kim | |
| 2012/0307504 A1 | 12/2012 | Chou | |
| 2014/0355273 A1* | 12/2014 | Saito | F21V 5/04 362/309 |

FOREIGN PATENT DOCUMENTS

| | | |
|---|---|---|
| DE | 10025647 | 11/2001 |
| DE | 10314357 | 10/2004 |
| DE | 102007054206 | 4/2009 |
| DE | 102009017424 | 10/2010 |
| DE | 202009007292 | 10/2010 |
| DE | 102010003805 | 10/2011 |
| DE | 102010014209 | 10/2011 |
| EP | 0635744 | 1/1995 |
| EP | 1382960 | 1/2004 |
| EP | 1548356 | 6/2005 |
| EP | 1890076 | 2/2008 |
| EP | 1998105 | 12/2008 |
| EP | 2039985 | 3/2009 |
| JP | 0737401 | 2/1995 |
| JP | 2005093622 | 4/2005 |
| JP | 2008221530 | 9/2008 |
| WO | 9833007 | 7/1998 |
| WO | 0116524 | 3/2001 |
| WO | 2007088665 | 8/2007 |
| WO | 2011015113 | 2/2011 |
| WO | 2011027267 | 3/2011 |

OTHER PUBLICATIONS

Supplemental European Search Report for EP 06746894, Completed by the European Patent Office on Sep. 25, 2009, 2 Pages.
International Search Report for PCT/EP2012/063135, English translation attached to original, Both completed by the European Patent Office on Nov. 22, 2012, All together 7 Pages.

* cited by examiner

LIGHT MODIFIER HAVING COMPLEX LENSES FOR LED LUMINAIRES

CROSS-REFERENCE TO RELATED APPLICATION

This application is the U.S. national phase of PCT Application No. PCT/EP2012/063135 filed on Jul. 5, 2012, which claims priority to German Patent Application No. 10 2011 078 865.4 filed on Jul. 8, 2011, and German Patent Application No. 10 2011 085 289.1 filed on Oct. 27, 2011, the disclosures of which are incorporated in their entirety by reference herein.

The present invention relates to a light-influencing element, which is provided for influencing the light emission of substantially punctiform light sources, in particular of LEDs. Furthermore, the present invention relates to a luminaire with such a light-influencing element.

The advances in the development of LEDs in recent years have led to such light sources being able to be increasingly used for illumination purposes. The luminous intensities that can be obtained with the aid of LEDs are now sufficiently high so that LEDs can replace previously used conventional light sources, such as e.g. incandescent lamps, fluorescent lamps or halogen lamps, in almost all fields of application. An advantage of using LEDs consists of these offering very good options for changing or modifying the light emission. Modern light sources based on LED for example, in particular, provide the option of setting the color or color temperature of the emitted light.

In principle, LEDs emit light over a relatively large solid angle. It is therefore conventional to assign optical elements, for example small reflectors or lenses, to the LEDs, by means of which optical elements the light emission is restricted or concentrated to a specific region in space. As a result of this, it is possible to ensure that the light emitted by the luminaire overall does not cause blinding of an observer or bothersome reflections on a reflecting surface, for example a screen or a tabletop.

Since individual manufacturing of lenses for influencing the light emission would be associated with extremely high outlay, use is usually made of light-influencing elements that consist of several lenses connected to one another. Here, the lenses are arranged in such a way that precisely one lens is assigned to each LED, wherein all lenses have the same design and accordingly influence the light of the respective LED in an identical manner. In accordance with a known embodiment, the frustum-like lenses in this case each have a cavity, which forms a light-entry region of the lens, and a light-exit face lying opposite to the light-entry region. Such light-influencing elements, which are preferably produced using an injection-molding method, are then arranged below the LEDs and form the or one light-exit element of the luminaire.

Depending on the field of application of a luminaire, different light-emission characteristics may be desired. Conventionally, the optical elements of a luminaire are designed in such a way that the light is primarily emitted symmetrically toward the underside, in particular without blinding. By contrast, when used in a business or store, it is often necessary to illuminate shelves extending laterally along the luminaire in a targeted manner. In this case, light should increasingly also be emitted laterally, which is more likely to be avoided in other cases in order to avoid undesired blinding. Furthermore, asymmetric light-emission characteristics are sometimes also desired, for example in order to brighten adjacent walls or objects in a targeted manner.

In principle, it would be feasible for an appropriately individually designed light-influencing element with specially adapted lenses to be produced for each application purpose. However, such a procedure is associated with extremely high outlay since the costs for an individual injection-molding tool, which is designed specifically for the desired light emission, are very high. A further problem also consists of the fact that, in the case of illumination systems in which a plurality of luminaires are arranged one behind the other in the longitudinal direction, the luminaires should in part have different emission characteristics while, on the other hand, a uniform appearance is desired. That is to say, although the luminaires should emit light in different ways, they should at least look very similar, ideally identical, to an observer.

The present invention is therefore based on the object of making available a novel solution for providing light-influencing elements of the type mentioned at the outset, by means of which light emission can take place as desired.

The object is achieved by a light-influencing element having the features of claim 1; advantageous developments of the invention are the subject matter of the dependent claims.

The main idea of the solution according to the invention is based on the discovery that, in the case of the aforementioned lens type with a cavity forming the light-entry region, it is sufficient to adapt the light-entry region of the lens in an appropriate manner in order to obtain a desired light-emission characteristic. In particular, provision is made here, according to the invention, for a beam splitter to be formed in the light-entry region of the lens, which beam splitter is preferably formed by one or more notches in the base area of the cavity. Since such a modification of the light-entry region of the lenses can be carried out comparatively easily, a substantial advantage of the solution according to the invention accordingly consists of the fact that light-influencing elements with a desired light-emission characteristic can be produced in a simple and cost-effective manner.

Accordingly, according to the invention, a light-influencing element for influencing the light emission of substantially punctiform light sources is proposed, wherein the light-influencing element has at least one lens, which has a cavity, which forms a light-entry region of the lens, and has a light-exit face lying opposite to the light-entry region, and wherein, according to the invention, a beam splitter is formed in the light-entry region of the lens.

The adaptation of the light-emission characteristic according to the invention by realizing a beam splitter in the light-entry region of the lens is also advantageous because the beam splitter or, in general, structures influencing the light, usually arranged in the light-exit region of a luminaire, are now shifted into the light-entry region of the lens and are therefore not visible to an observer. This means that the outer appearance, visible to the observer, of the lens arrangement is always the same and the emission characteristic is now brought about by the change of the lens in the interior, which was not possible in the previously known solutions.

As already indicated, the beam splitter is preferably realized by one or more notches, which is or are formed in the base area of the cavity. Here, the light emission can be set depending on the embodiment of the notch(es). Here, the beam splitter can bring about both a symmetric splitting of the light beam and also an asymmetric light deflection.

The lenses of the light-influencing element according to the invention preferably substantially have a frustum-like design, wherein—once again for obtaining an appearance that is as uniform as possible—the lateral faces of the lenses can have an identical design. The cavities of the lenses can have a polygonal cross section or a rotationally symmetric design.

A further advantage of the solution according to the invention also consists of the fact that, in particular, the option exists of directing the light emission in a specific direction. By way of example, if the light-entry regions of the lenses are designed in such a way that an asymmetric light emission is obtained, the direction of the light emission can be influenced in a targeted manner by an appropriate adaptation of the orientation of the lenses. This renders it possible to direct light to a specific side in a targeted manner and, for example, form what is known as a wallwasher. By contrast, by an alternating arrangement of appropriately designed lenses, a uniform light emission in different directions could in turn be realized. In all these variants, the corresponding light-influencing elements can be produced in a comparatively simple and cost-effective manner.

The light-influencing element preferably has a plurality of lenses, which are arranged next to one another and integrally connected to one another. Here, these lenses can all be identical or else be formed differently in respect of the light-entry regions thereof. However, a uniform appearance is preferably, in principle, ensured by virtue of the fact that all lenses have a preferably rectangular, in particular square, light-exit face with an identical design.

In the following text, the invention is to be explained in more detail on the basis of the attached drawing. In detail:

Figure 1:
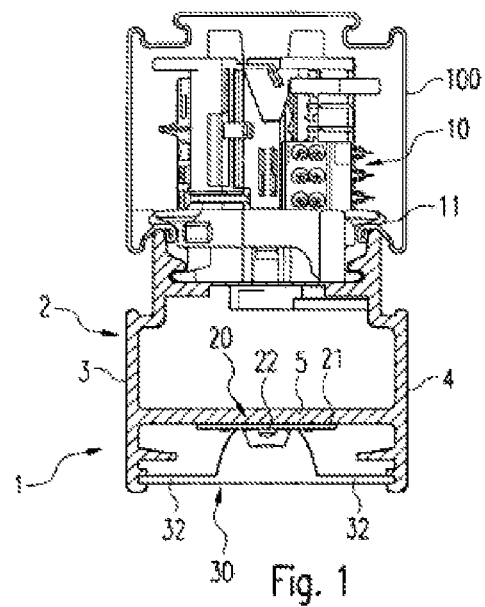
FIGS. 1 and 2 show views of a luminaire, in which use is made of light-influencing elements designed according to the invention.

Before the embodiment of the light-influencing elements or lenses according to the invention are be explained in more detail, an exemplary embodiment of a luminaire, in which such light-influencing elements are preferably used, is to be described initially. This luminaire depicted in FIGS. 1 and 2 and generally provided with the reference sign 1 is a batten luminaire, i.e. a luminaire with an elongate design, which is provided for use in a busbar system. However, the light-influencing elements according to the invention are by no means restricted to use in such batten luminaires but can naturally also be used in other luminaires, which are not provided for connection to a busbar system. In particular, this also includes wall luminaires or floor luminaires.

Firstly, the luminaire 1 has an elongate profile body 2 as supporting element, which can, for example, be embodied as aluminum extrusion profile. The profile body 2 consists of two sidewalls 3 and 4, which extend parallel to one another and which are connected to one another by a central limb 5. Anchored in the upper region of the profile body 2 is what is known as a rotary tapping 10, which enables the mechanical attachment of the luminaire 1 on a support rail 100 and furthermore the contacting of lines extending within the support rail 100. To this end, the rotary tapping 10 has corresponding projections 11 and contacts 12, which are pivoted out laterally by rotation and, as a result of this, engage behind projections on the support rail 100 or come into contact with corresponding conductors. Such rotary tappings are already known, with reference in this respect being made, for example, to DE 10 025 647 A1 by the applicant, which describes a corresponding busbar system.

As mentioned previously, LEDs are used as light sources in the present case. To this end, a plurality of LED modules 20 are arranged one behind the other in the longitudinal direction on the underside of the central limb 5 of the profile body 2, which LED modules each have an elongate printed circuit board 21 and LEDs 22 arranged thereon. In the case of a luminaire of a conventional length, approximately four to five such LED modules 20 are generally arranged one behind the other in the longitudinal direction. These LED modules 20 are preferably attached to the central limb 5 by adhesive bonding, with, however, a screwed or latching connection also being feasible. In particular, there should be good thermal contact between LED module 20 and central limb 5, in order to enable effective dissipation of the heat occurring during the operation of the LEDs 22. It should be noted that the term LEDs in the present case should be understood to mean both individual LEDs and LED clusters, for example an RGB arrangement.

Figure 3:
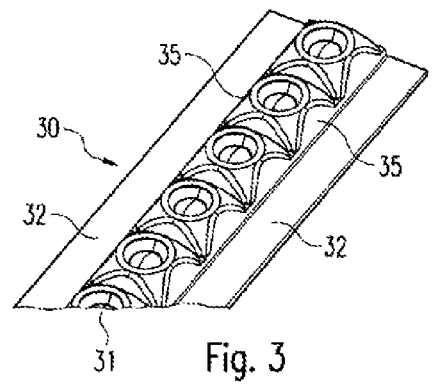
FIG. 3 shows the view of a first exemplary embodiment of a light-influencing element according to the invention.

The light emitted by the LEDs 22 is radiated with the aid of a light-influencing element 30, the embodiment of which can, in particular, be gathered from FIG. 3.

The light-influencing element 30 consisting of a transparent plastics material has an elongate design and has a central middling region 31, which is formed by a plurality of lenses 35 arranged one behind the other in the longitudinal direction. The dimensions and arrangement of the lenses 35 are such in this case that an individual lens 35 is assigned to each LED 22. The light-influencing element 30 with an integral design preferably has a length corresponding to that of an LED printed circuit board 20. With the aid of two laterally protruding arms 32, which are preferably likewise transparent, it is possible to attach the element on the profile body 2; for example, it can be clamped to the latter.

Figure 4:
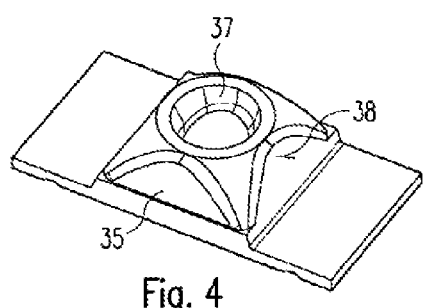
FIGS. 4 and 5 show views of lenses, as used previously in a light-influencing element in accordance with the depiction of FIG. 3.
Figure 5:
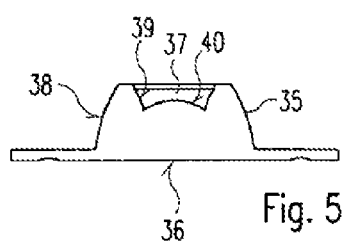

In such a light-influencing element 30, use was, until now, often made of lenses 35 as depicted in FIGS. 4 and 5. Here, each lens 35 has an approximately frustum-like design and, on its underside, has a rectangular, preferably square, base area, which forms the light-exit face 36 and by means of which the light is ultimately emitted. A recess or cavity 37, the circumferential face and base area of which form the light-entry region of the lens 35, is arranged on the side of the lens body lying opposite to the light-exit face 36.

Figure 2:
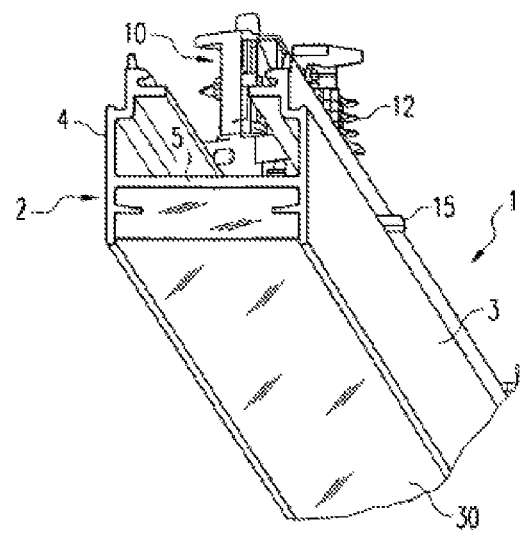

As can be gathered from the depiction of FIG. 1, the LED 22 slightly protrudes into the associated cavity 37 in the assembled state of the light-influencing element 30 on the profile body 2. Since the light from the LED 22 is emitted substantially rotationally symmetrically over a very broad solid angle, the light is coupled into the lens body both by means of the base area and by means of the lateral face of the cavity 37. Some of the light in this case directly reaches the light-exit face 36 and is emitted by the latter. By contrast, a further part of the light undergoes total internal reflection on the lateral face 38 of the frustum-like lens body and is directed onto the light-exit face 36 in this manner.

Figure 8A:
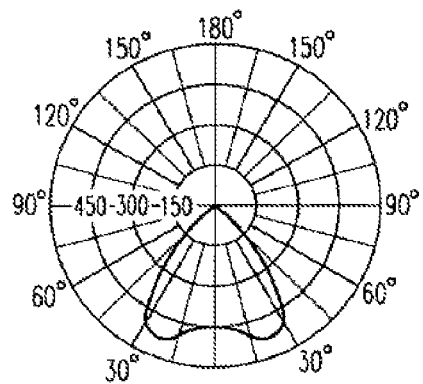
FIGS. 8a and 8b show light-distribution curves of the lenses from FIGS. 4 to 7.

In the depicted embodiment, the cavities 37 of the lenses 35 have rotationally symmetric designs. They have slightly bent side faces 39 and an arced base area 40. In such an embodiment, a light distribution as depicted schematically in FIG. 8a is obtained. It is possible to identify that there is a concentrated light emission directly toward the underside. By way of example, such light emission is desired if blinding of persons situated in the vicinity of the luminaire should be avoided at flat viewing angles.

Figure 8B:
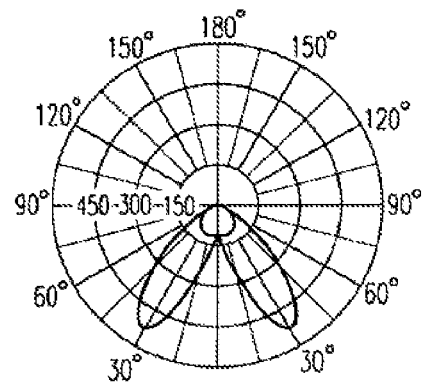

By contrast, if the luminaire is used in a business setting, for example between two rows or walls of shelves extending parallel to one another, it is often more likely the case that a light distribution is desired as depicted schematically in FIG. 8b. Thus, in this case, less light should be emitted directly downward, but it should rather be additionally emitted symmetrically into two lateral regions lying opposite to one another.

In order to realize such a different light-distribution curve, it was necessary until now to develop a completely new light-influencing element or to arrange additional optical means in the light-exit region of the luminaire. However, the production of a corresponding individual injection-molding tool for this was associated with a very high cost outlay.

According to the invention, a solution is now proposed which significantly simplifies the adaptation of the light-distribution characteristic. This solution is based on the discovery that the light distribution can be adapted as desired, in particular by a corresponding design of the light-entry region of the lenses 35. By contrast, the further elements of the lens 35, in particular the light-exit face 36 and the lateral face 38 of the lens body, do not need to be modified and the use of additional optical means is not required. Firstly, this leads to the advantage that, even in the case of different light-emission characteristics, the appearance of the light-influencing element remains unchanged. Furthermore, the production of a correspondingly designed light-influencing element with a modified light-distribution curve is now significantly more cost-effective.

Figure 6:
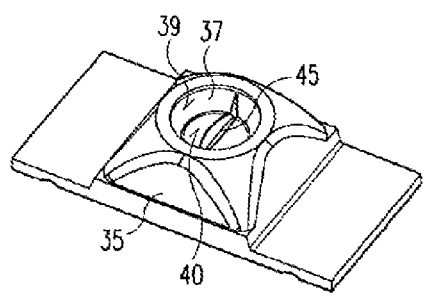
FIGS. 6 and 7 show a first embodiment of a lens according to the invention.
Figure 7:
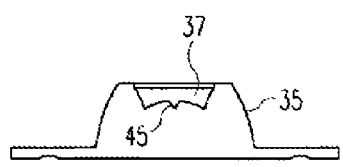

A first variant of a lens according to the invention is, in this case, depicted in FIGS. 6 and 7, wherein the depicted lens 35 is distinguished by virtue of the fact that the cavity 37 of the light-entry region has a beam splitter 45. In the present case, this beam splitter 45 is formed by a single notch, which is primarily formed in the base area 40 of the cavity 37, but can optionally also extend through the circumferential face 39 of the cavity. As mentioned previously, a beam splitter 45 is realized by this notch, which beam splitter laterally deflects or splits the incident light, which as such is emitted substantially unhindered to the underside, so that, ultimately, the sought-after, symmetric, lateral light emission in accordance with FIG. 8b is obtained.

The peculiarity of the solution according to the invention lies in the fact that the beam splitter usually arranged in the light-exit region of a luminaire or, in general, an additional optical element usually arranged in the light-exit region is now shifted into the light-entry region of the lens, resulting in it not being visible to an observer. This means that the external appearance, visible to the observer, of the lens arrangement is always the same, in particular corresponding to the appearance of a light-influencing element with the known lenses in accordance with FIGS. 4 and 5, but the light-emission characteristic can be greatly modified and, in particular, adapted to individual wishes by changing the lens in the interior.

Figure 9:
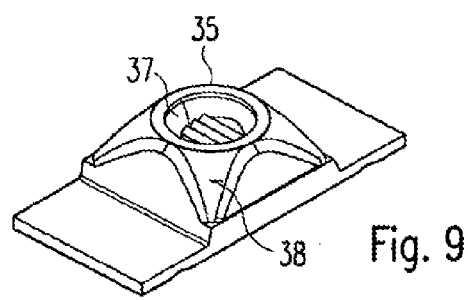
FIGS. 9 to 11 show views of a second embodiment of a lens according to the invention.
Figure 10:
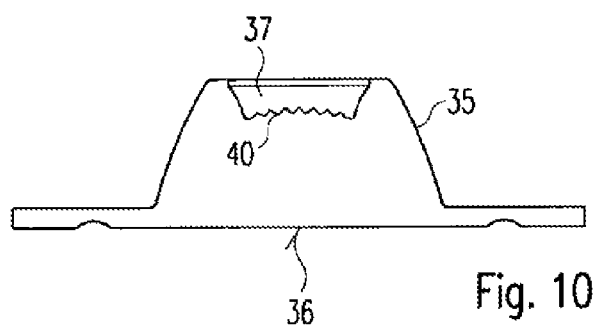
Figure 11:
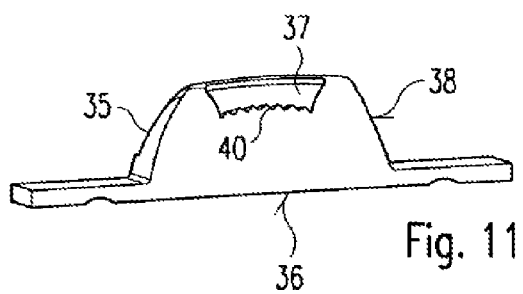

A second option for realizing the beam splitter according to the invention is depicted in FIGS. 9 to 11. In respect of its lens body and the light-exit region, the lens 35 shown in these figures is similar to the lenses 35 shown above; i.e., it cannot be distinguished from the other lenses in the state assembled in the luminaire. However, in this variant too, the light-entry region, in particular the base area 40 of the cavity 37, is designed in a special manner in order, ultimately, to obtain a desired light-emission characteristic. In the present case, the base area 40 now has a corrugated design, i.e. it consists of a plurality of notches extending next to one another, by means of which, once again, a beam splitter 45 is formed. In this case too, a deflection or splitting of the light is accordingly achieved, and so a light-distribution curve in accordance with FIG. 8b is obtained.

Figure 12:
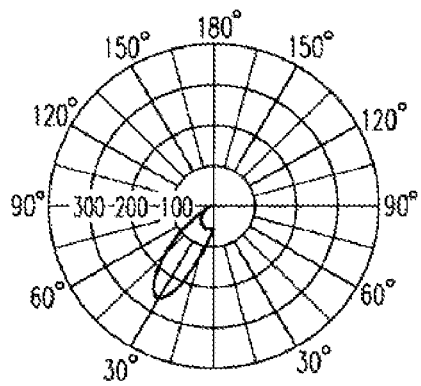
FIG. 12 shows the schematic procedure for obtaining a symmetrical light distribution when using asymmetrically designed lenses and FIG. 13 shows a possible variant for the simultaneous use of lenses with asymmetric light emission.
Figure 12:
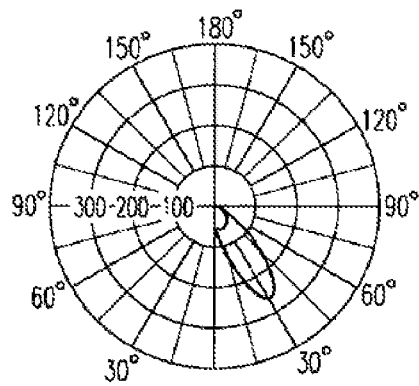
Figure 12:
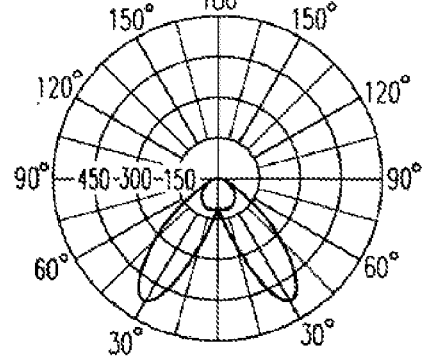

A further option for using a beam splitter also consists of embodying the light-entry region of a lens in such a way that an asymmetric light emission is obtained, as is depicted, for example, schematically in the upper left-hand region of FIG. 12. Here, a beam splitter, in general, denotes an optical measure—in the present case, an appropriate design of the light-entry region of the lens—which deflects or splits the light in one or more desired directions. Such a light-emission characteristic in accordance with FIG. 12 can also be obtained by a corresponding adaptation of the cavity or the light-entry region of the lens, without the light-exit region or the shape of the lateral face of the lens body having to be adapted for this.

If use is only made of such lenses with an asymmetric design, the light is only emitted laterally into the left-hand lower region and can, for example, be employed to illuminate a wall region or an object situated there. A luminaire with such a light-influencing element could thus be used as a wallwasher, with, however, an observer being unable to distinguish it from a luminaire with a light-emission characteristic as per FIG. 8a or 8b because, in principle, the light-influencing elements 30 have an identical design in terms of the light-exit region thereof. Naturally, the lenses could, in the same way, also be designed in such a way that the light is emitted to the right-hand underside, as depicted in the right-hand upper region of FIG. 12.

However, if lenses which, on the one hand, primarily emit to the left-hand side and, on the other hand, primarily emit to the right-hand side are now used alternately within a light-influencing element, an "averaged" light-emission characteristic is obtained overall, as shown in the lower region of FIG. 12. Thus, a light-distribution curve which emits symmetrically to both sides and substantially corresponds to that of FIG. 8b is once again obtained.

Figure 13:
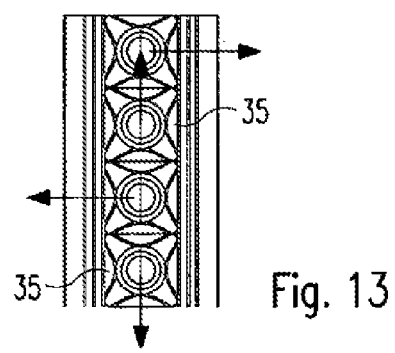

A further option for employing differently oriented, asymmetrically designed lenses is depicted in FIG. 13. Here, successive lenses 35 are in each case embodied in such a way that the asymmetric light emission—indicated schematically by an arrow—is rotated by 90° in each case. In combination, this obtains a light emission in all four main directions.

Furthermore, it would also be feasible to orient the lenses embodied for asymmetric light emission in such a way that the light emission occurs along the longitudinal direction of the luminaire. As a result of this, an object or a wall in an end region of a luminaire could be illuminated in a targeted manner. A suitable field of application for this would be, for example, a blackboard lighting, wherein additional luminaires aligned perpendicular to the general illumination could be dispensed with for this.

All these exemplary embodiments clarify that the introduction of a beam splitter into the light-entry region of a lens brings clear advantages, because in this manner, or the use of additional optical means, very different light-emission characteristics can be achieved for a light-influencing element, wherein, however, the appearance of the light-influencing element remains unchanged to a user.

The invention claimed is:

1. A light modifier comprising:
   at least one lens, each lens having a light-incident portion including a cavity, a light-exit face lying opposite to the light-incident portion, and a beam splitting element formed in the light-incident portion,
   wherein the light-exit face of the lens is rectangular and the beam splitting element is configured to project an asymmetric light emission.

2. The light modifier as claimed in claim 1, wherein the beam splitting element is formed by one or more notches on a surface of the cavity.

3. A luminaire comprising a plurality of substantially punctiform light sources arranged next to one another, and a light modifier as claimed in claim 1 coupled to the light sources.

4. The luminaire as claimed in claim 3, wherein the substantially punctiform light sources are LEDs.

5. The light modifier as claimed in claim 1, wherein the at least one lens is a plurality of lenses arranged next to one another and integrally connected.

6. The light modifier as claimed in claim 5, wherein all lenses have a rectangular shape, and the light-exit faces having the same shape.

7. The light modifier as claimed in claim 5, wherein the lenses have a substantially frustum shape, and lateral faces of the lenses have the same shape.

8. The light modifier as claimed in claim 5, wherein the cavities of at least two of the lenses have different shapes.

9. A light modifier comprising:
   at least one lens, each lens having a light-incident portion including a cavity, a light-exit face lying opposite to the light-incident portion, and a beam splitting element formed in the light-incident portion;
   wherein,
   the light-exit face of the lens is rectangular and the beam splitting means are configured to project an asymmetric light emission;
   the at least one lens is a plurality of lenses arranged next to one another and integrally connected;
   the cavities of at least two of the lenses have different shapes; and
   each beam splitting element is formed by a notch, wherein the notches of different lenses are oriented differently with respect to one another.

10. A luminaire comprising a plurality of substantially punctiform light sources arranged next to one another, and a light modifier as claimed in claim 9 coupled to the light sources.

11. The luminaire as claimed in claim 10, wherein the substantially punctiform light sources are LED's.

* * * * *